(12) United States Patent
Wang

(10) Patent No.: US 6,410,924 B1
(45) Date of Patent: Jun. 25, 2002

(54) ENERGY FILTERED FOCUSED ION BEAM COLUMN

(75) Inventor: Li Wang, San Jose, CA (US)

(73) Assignee: Schlumberger Technologies, Inc., San Jose, CA (US)

( * ) Notice: Subject to any disclaimer, the term of this patent is extended or adjusted under 35 U.S.C. 154(b) by 0 days.

(21) Appl. No.: 09/440,985

(22) Filed: Nov. 16, 1999

(51) Int. Cl.⁷ .............................. H01J 49/48; H01J 49/44
(52) U.S. Cl. ........................................ 250/398; 250/305
(58) Field of Search ................................ 250/281, 287, 250/293, 396 R, 397, 398

(56) References Cited

U.S. PATENT DOCUMENTS

| | | | | |
|---|---|---|---|---|
| 4,223,223 A | * | 9/1980 | Hofer et al. ................. | 250/397 |
| 4,697,086 A | | 9/1987 | Ishitani et al. ............. | 250/492.2 |
| 4,789,787 A | | 12/1988 | Parker .................. | 250/396 ML |
| 4,962,313 A | * | 10/1990 | Rose ........................... | 250/311 |
| 5,126,565 A | * | 6/1992 | Rose ........................... | 250/305 |
| 5,189,303 A | | 2/1993 | Tanjyo et al. ................ | 250/296 |
| 5,300,775 A | | 4/1994 | Van der Mast ............. | 250/305 |
| 5,717,204 A | | 2/1998 | Meisburger et al. ......... | 250/310 |
| 5,825,035 A | | 10/1998 | Mizumura et al. ....... | 250/423 R |
| 5,838,004 A | | 11/1998 | Tiemeijer et al. ........... | 250/305 |
| 6,111,253 A | * | 8/2000 | Tsuno .......................... | 250/311 |
| 6,191,417 B1 | * | 2/2001 | Douglas et al. ............. | 250/282 |

FOREIGN PATENT DOCUMENTS

| | | |
|---|---|---|
| EP | 0 556 411 A1 | 8/1993 |
| NL | 1 364 930 | 8/1971 |

* cited by examiner

*Primary Examiner*—Bruce Anderson
*Assistant Examiner*—Anthony Quash
(74) *Attorney, Agent, or Firm*—Skjerven Morrill MacPherson LLP

(57) ABSTRACT

The resolution of a charged particle beam, such as a focused ion beam (FIB), is optimized by providing an energy filter in the ion beam stream. The energy filter permits ions having a desired energy range to pass while dispersing and filtering out any ions outside the desired energy range. By reducing the energy spread of the ion beam, the chromatic aberration of the ion beam is reduced. Consequently, the current density of the ion beam is increased. The energy filter may be, e.g., a Wien type filter that is optimized as an energy filter as opposed to a mass filter. For example, to achieve useful dispersion the energy filter may use a quadrupole structure between two magnetic pole pieces thereby producing a combined quadrupole electric field and dipole electric field within a magnetic field.

1 Claim, 4 Drawing Sheets

ENERGY FILTERED FOCUSED ION BEAM COLUMN

FIELD OF THE INVENTION

The present invention relates to optimizing a charged particle beam device, such as a focused ion beam (FIB) device, and in particular to optimizing the chromatic aberration in a FIB using an energy filter.

BACKGROUND

Liquid metal ion source (LMIS) based focused ion beam (FIB) systems are an important, sometimes indispensable tool, in many branches of science and industry, especially in the semiconductor industry. The applications of current FIB systems include device modification, failure analysis, probe point creation, photomask repair, maskless lithography, transmission electron microscope (TEM) sample preparation, scanning ion microscopy and secondary ion mass spectroscopy.

Current applications of FIB systems require a high resolution, i.e., small beam diameter, and high current density. As is well known, the central part of a FIB system is the column, which consists of a LMIS and charged particle optical components which perform extracting, transporting, deflecting and focusing of the ion beam. FIB systems are well known, see for example, U.S. Pat. No. 5,825,035, which is incorporated herein by reference.

The resolution of a conventional column for most useful beam current ranges is limited in the form of chromatic aberration due to the large energy spread of the LMIS, which is in a range of 5 eV–10 eV. Because the energy spread is intrinsic in LMISs, there is no effective way to reduce the energy spread further by tuning the emission of the LMIS. In general, the characteristics of the column dominate the overall FIB system performance. Thus, the intrinsic energy spread of the LMIS significantly affects the performance of a conventional FIB system.

SUMMARY

In accordance with the present invention, a charged particle beam is passed through an energy filter to alleviate the chromatic aberration. A charged particle source, such as a LMIS is used to produce charged particles. An energy filter downstream of the charged particle source reduces the energy spread of the charged particle beam by passing only the charged particles that are within a desired energy range. By reducing the energy spread of the charged particle beam, the chromatic aberration of the system is reduced, thereby increasing the current density of the beam.

The energy filter may be, e.g., a Wien filter that is optimized for energy filtering purposes. For example, the energy filter may use a quadrupole structure between two magnetic pole pieces thereby producing a combined quadrupole electric field and dipole electric field within a magnetic field. The quadrupole structure may be four hyperbolic surfaces or, e.g., four cylindrical surfaces with axes that run parallel to the direction of travel of the charged particle beam. With the proper application of voltages on the quadrupole structure, a combined quadrupole electric field and dipole electric field may be generated and which will act as the desired energy filter.

BRIEF DESCRIPTION OF THE DRAWINGS

The above and other features, aspects, and advantages of the present invention will become better understood with regard to the following description, appended claims, and accompanying figures, where:

DETAILED DESCRIPTION

Figure 1:
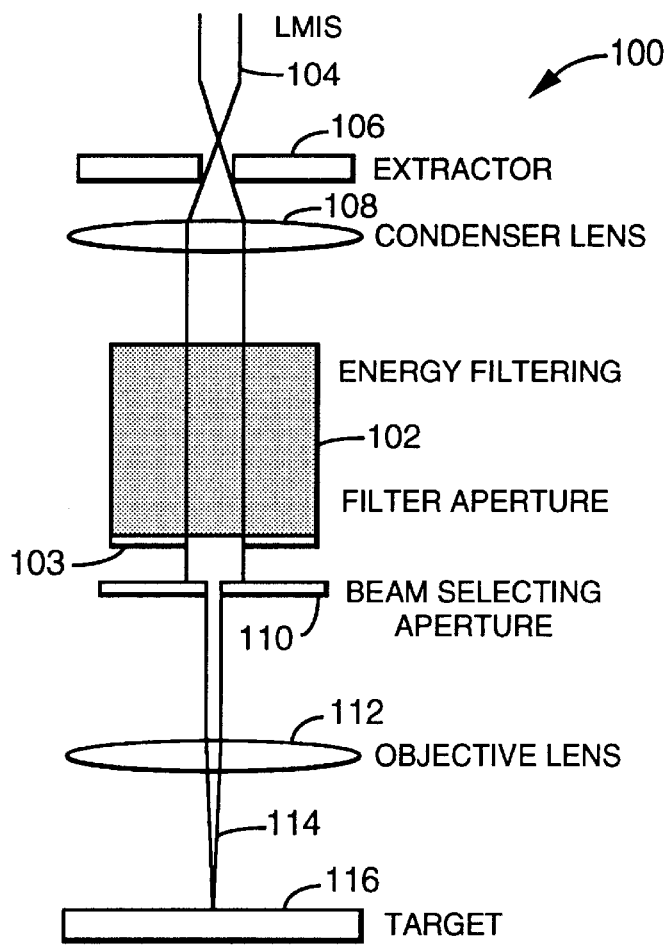
FIG. 1 shows a high resolution, high current density FIB column that includes an energy filter in accordance with an embodiment of the present invention.

FIG. 1 shows a high resolution, high current density FIB column 100 that includes an energy filter 102 in accordance with an embodiment of the present invention. As shown in FIG. 1, FIB column 100 includes an LMIS 104 (such as a Ga LMIS), an extractor 106, condenser lens 108, beam selecting aperture 110 and an objective lens 112. FIB column 100 focuses an ion beam 114 onto a target 116. Energy filter 102 is placed anywhere between condenser lens 108 and beam selecting aperture 110 and may be, for example, a Wien filter having a filter aperture 103 and that is optimized for energy filtering.

Chromatic aberration in a conventional FIB column can expressed as:

$$d_c = \alpha C c \frac{\Delta U}{U} \tag{1}$$

where $d_c$ is chromatic aberration; $\alpha$ is the acceptance half angle which is determined by the beam current limiting aperture and is a fixed value for a given beam current; $C_c$ is the chromatic aberration coefficient of the column on the object side; $\Delta U$ is the energy spread of the beam; and U is the beam energy. According to Equation (1), one intuitive way to reduce the chromatic aberration is to increase the beam energy U. However, in practice there are many difficulties to simply increase beam energy U to reduce chromatic aberration. For example, sometimes higher beam energy is not desirable or is even detrimental in many applications. Increasing beam energy often requires larger and more expensive power supplies, more stringent requirements on insulators and larger gaps among the optical elements. Larger gaps among the optical elements usually results in a larger chromatic aberration coefficient $C_c$, which increases chromatic aberration as opposed to reducing it.

In accordance with the present invention, an energy filter 102 is added to the FIB column 100, which controls the energy spread of the ion beam by letting a specific energy range of the ions continue on their original path and eliminating the ions with the unwanted energy. Consequently, the energy spread $\Delta U$ of Equation (1) is reduced, which reduces the chromatic aberration $d_c$.

At first glance it may appear that the addition of an energy filter reduces the energy spread $\Delta U$ by sacrificing the beam current (or angular intensity), and thus the chromatic aberration may not be reduced because the acceptance half angle α must be increased to maintain the same beam current. However, by creating an energy dispersion in one direction, the rate of reduction of the energy spread ΔU is larger than the rate of the increase of the acceptance half angle α.

Suppose the energy spread after the energy filtering is $\Delta U_1$, then the chromatic aberration $d_c$ for the beam current becomes:

$$d_c = \left(\alpha\sqrt{\frac{\Delta U}{\Delta U_1}}\right)C_c\frac{\Delta U_1}{U} = \alpha C_c\frac{\sqrt{\Delta U \Delta U_1}}{U} \qquad (2)$$

Note that the acceptance half angle becomes $\alpha\sqrt{\Delta U/\Delta U_1}$ to maintain the same beam current since the beam current is proportional to $\alpha^2$. Equation (2) tells us that the chromatic aberration $d_c$ is reduced $\sqrt{\Delta U/\Delta U_1}$ times relative to an ion produced by a non-energy filtered FIB column. Thus, for example, if $\Delta U_1=1$ eV, $\Delta U=5$ eV, then the chromatic aberration $d_c$ of the energy filtered ion beam is 2.24 times smaller than the non-energy filtered ion beam. For a chromatic aberration dominated situation such as that found with a FIB column, the final resolution of the system will be improved approximately by the same factor.

Because the FIB column 100 benefits from a decreased chromatic aberration, FIB column 100 also benefits from an enhanced current density. For a chromatic aberration dominated system, if we use the chromatic aberration $d_c$ to represent the total beam size, the current density on the target 116 for beam current I is:

$$J = \frac{I}{\pi\left(\frac{d_c}{2}\right)^2} = \frac{4I}{\pi d_c^2}. \qquad (3)$$

After energy filtering, the chromatic aberration $d_c$ is $d_c\sqrt{\Delta U/\Delta U_1}$ for the same current I. Thus J becomes:

$$J = \frac{4I}{\pi d_c^2}\frac{\Delta U}{\Delta U_1}. \qquad (4)$$

In other words, the current density is enhanced by a factor of $\Delta U/\Delta U_1$.

As discussed above, energy filter 102 may be, for example, a Wien filter. Wien filters are conventionally used in FIB columns as a mass separator. For more information on Wien filters used as mass separators, see U.S. Pat. Nos. 5,189,303 and 4,789,787, both of which are incorporated herein by reference.

Figure 2:
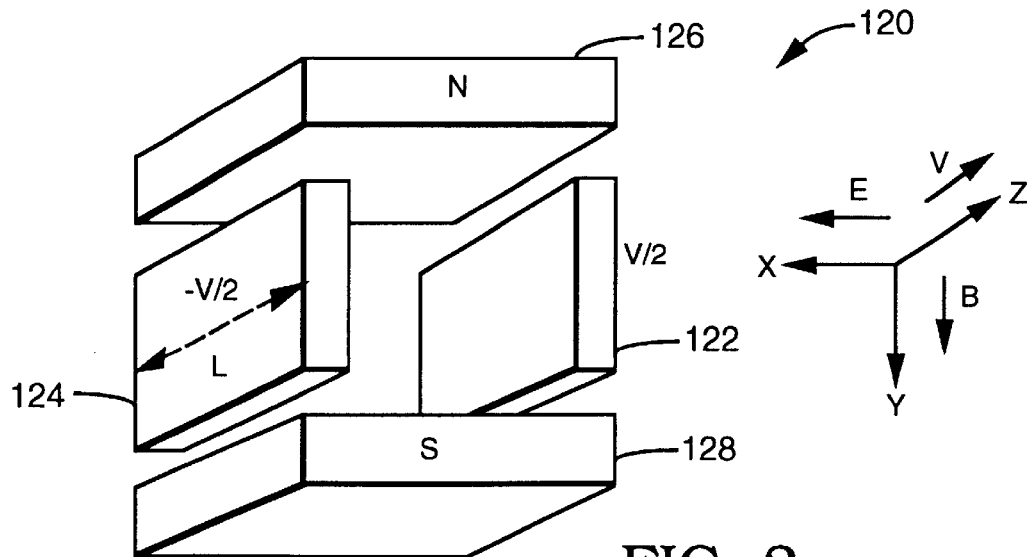
FIG. 2 shows a conventional Wien filter used as a speed filtering device.

FIG. 2 shows a conventional Wien filter 120, which is a speed filtering device that utilizes an electric field E created between two plates 122, 124 with voltage +V/2 and −V/2, respectively, and a perpendicular magnetic field B created between two magnetic pole pieces 126, 128. Magnetic pole pieces 126, 128 may be, for example, permanent magnets, electric coils, or a combination of permanent magnets and electric coils. The direction of an ion beam passing through Wien filter 120 is perpendicular to the planes of E and B. Ions of different masses and charges are deflected differently. The condition for passing through the Wien filter 120 undeflected (straight-through condition) for ions with a speed v is:

$$E=vB \qquad (5)$$

The deflection of ions upon leaving the Wien filter 120 with mass m+Δm when the straight-through condition for mass m is maintained is derived as:

$$\Delta x=-(L^2/2)E/2V(\Delta m/m) \qquad (6)$$

where L is the length of the filter and V is the ion acceleration voltage. The mass separation principle revealed in Equation (6) has been extensively exploited in the traditional Wien filters used in FIB columns.

The traditional Wien filter, however, only utilizes one aspect of its filtering capability, i.e., mass filtering. The other aspect of the filtering capability, which is used in accordance with the present invention, is beam energy filtering.

To fully appreciate the design of a filter designed as an energy filter, it is useful to discuss the operation of a conventional Wien filter 120, such as that shown in FIG. 2.

Figure 3:
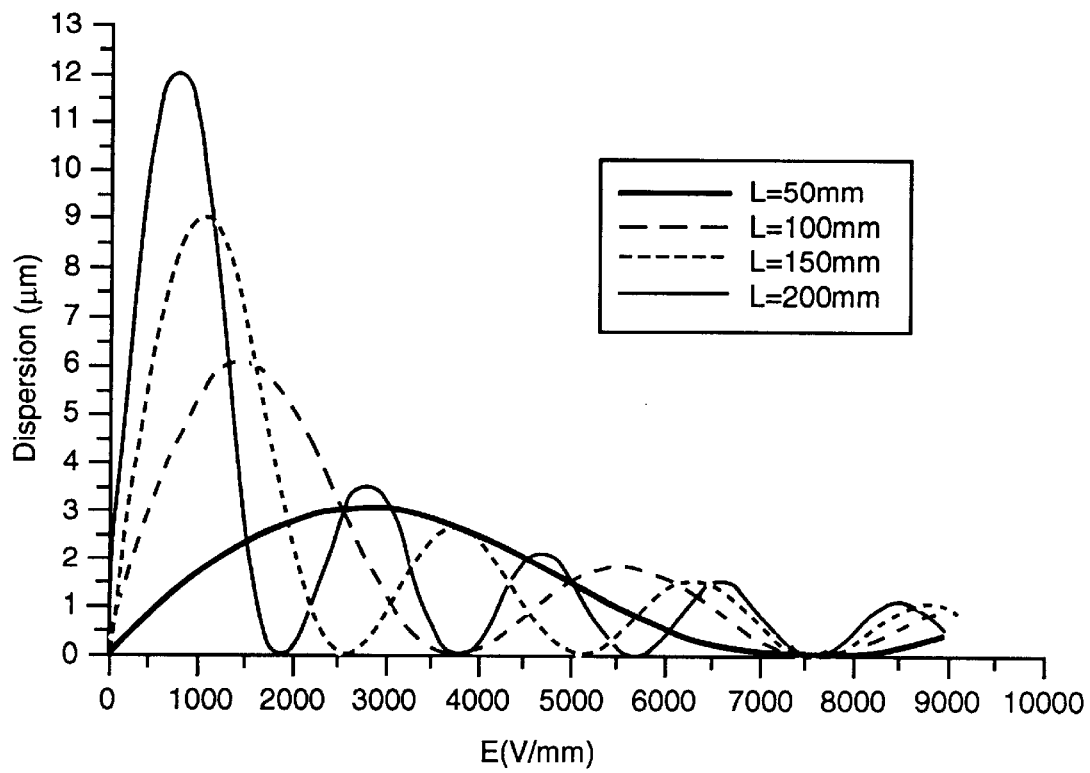
FIG. 3 plots the dispersion against the electric field in a conventional Wien filter.

For a conventional uniform field Wien filter in which E and B are constant, the space dispersion of the ions upon leaving the filter in the x direction of the coordinate system shown in FIG. 2 is:

$$\Delta x = \frac{\Delta U}{qE}\left[1 - \cos\left(\frac{qEL}{2U}\right)\right] \qquad (7)$$

Where q is the charge of the ions and U is the beam energy. There is no dispersion in the y and z directions. FIG. 3 plots the dispersion Δx in micrometers (μm) against the electric field E, where the beam energy U=30 keV, the energy spread ΔU=5 eV, and the Wien filter length L=50 mm, 100 mm, 150 mm and 200 mm. As shown in FIG. 3, the dispersion Δx is very small for this type of Wien filter and energy range. Thus, a traditional Wien filter 120 is not suitable as an energy filter in the present invention because a filter aperture less than a few microns is difficult to make and would not last long as a result of ion beam etching effect. Also the beam current that can pass through the filter would be extremely small for a column in non-crossover mode.

Figure 4:
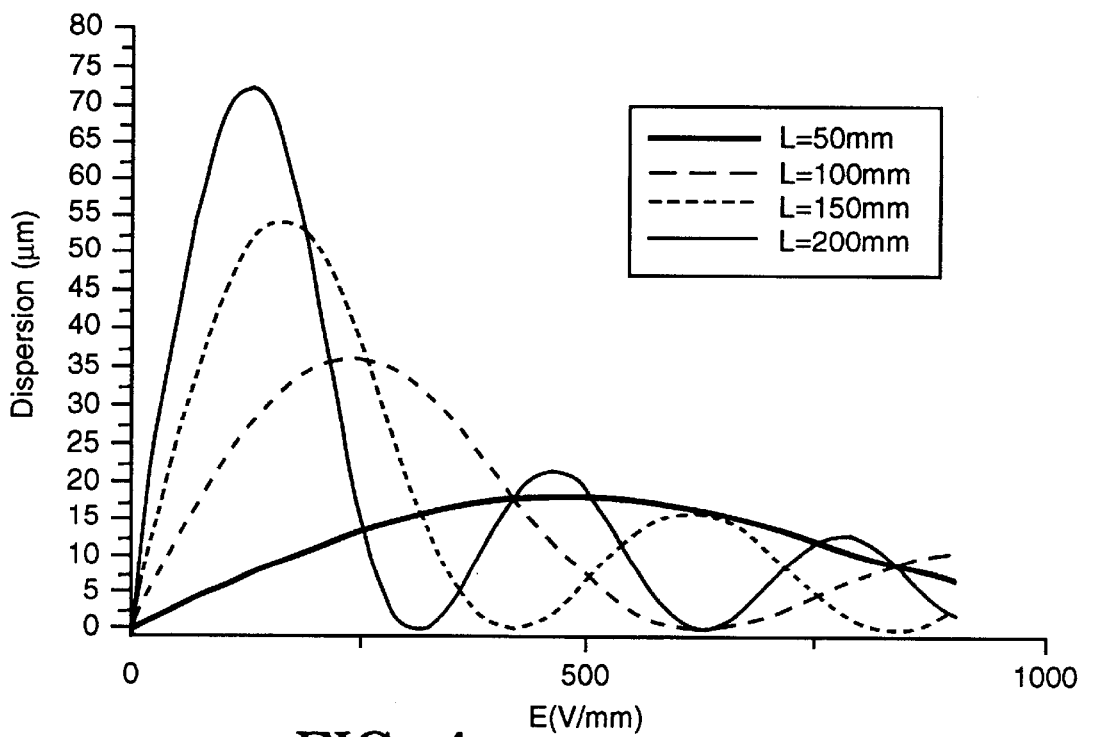
FIG. 4 plots the dispersion against electric field in a conventional Wien filter when the beam energy is lowered to 5 keV.

One solution is to lower the beam energy U inside the Wien filter 120 by floating the filter electrodes 122, 124 the filter entrance and exit apertures (not shown) to a particular voltage to retard the ion beam. FIG. 4 plots the dispersion Δx against electric field E when the beam energy U is lowered to 5 keV and the energy spread ΔU=5 eV. As shown in FIG. 4, the dispersion Δx is increased dramatically. However, this level of dispersion may still not be large enough for non-crossover mode beams. In addition, the optical design of the FIB column is more complicated because of the retarding of the ion beam by the energy filter.

Figure 5:
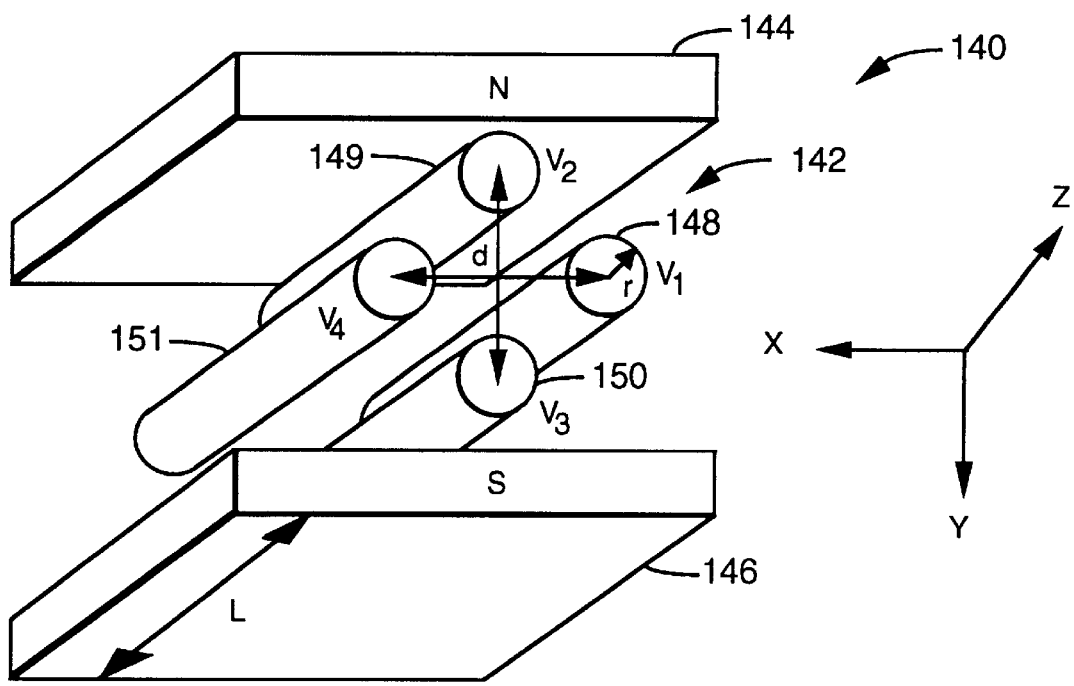
FIG. 5 illustrates a Wien type energy filter that may be used as the energy filter shown in FIG. 1 in accordance with an embodiment of the present invention.

FIG. 5 illustrates a Wien type energy filter 140 that may be used as energy filter 102 in FIB column 100 in accordance with an embodiment of the present invention. Because the space dispersion due to the 5–10 eV energy spread is usually much smaller than the space dispersion due to different masses, the geometrical design and the field strength used with energy filter 140 is very different from a conventional Wien filter 120 used as a mass separator. Thus, filter 140 is very suitable for the energy filtering purpose because it can create large dispersions.

As shown in FIG. 5, the electrical field in filter 140 is created by a quadrupole structure 142 positioned between two opposing magnetic pole pieces 144, 146. Magnetic pole pieces 144, 146 may be, e.g., 100 mm in length and a width of 10 mm, but, of course, any appropriate length and width may be used. Ideally, four hyperbolic surfaces are used to generate a perfect quadrupole field within the magnetic field. For practical reasons, four cylinders 148, 149, 150, 151 are used because they have cylindrical surfaces which are close to a hyperbolic shape and are easy to manufacture. Cylinders 148–151 each have a radius r of approximately 0.01 to 10 mm, e.g., 1.5 mm. Cylinders 148 and 151 and cylinders 149 and 150 are separated by a distance d of approximately 1 to 30 mm, e.g., 6 mm. Cylindrical surfaces 148–151 may be manufactured from any conductive material, for example, steel or any other appropriate material. Of course, if desired, the cylinders 148–151 may have any appropriate radius r and separation distance d. Further, each individual cylinder 148–151 may have a different radius. Thus, quadrupole structure 142 may or may not be symmetrical.

Moreover, it should be understood that while energy filter 140 is described as having a quadrupole structure, other types of structures that provide a non-linear electrical field may be used, e.g., an octopole structure.

With the use of a quadrupole structure 142, and the proper application of voltages V1, V2, V3, and V4 to cylinders 148, 149, 150, and 151, respectively, a combination of a quadrupole field and a dipole field can be generated that is describe by:

$$\bar{E} = E_0\left(1 + \frac{ax}{L}\right)\hat{x} - \frac{ax}{L}\hat{y}. \quad (8)$$

The unit a is a dimensionless parameter. For the situation with such an electric field and a magnetic field $\bar{B} = B\hat{y}$, the following formulas may be derived:

$$\Delta x = \frac{\Delta U}{qE_0 - 2aU/L}\left[1 - \cos\left(\sqrt{\frac{qE_0L}{U}\left(\frac{qE_0L}{4U} - \frac{a}{2}\right)}\right)\right], \quad (9)$$

for $a < \frac{qE_0L}{2U}$;

$$\Delta x = \frac{aL\Delta U}{4U} = \Delta x = \frac{qE_0L\Delta U}{4U^2}, \text{ for } a = \frac{qE_0L}{2U}; \quad (10)$$

$$\Delta x = \frac{\Delta U}{2aU/L - qE_0}\left[\cosh\left(\sqrt{\frac{qE_0L}{U}\left(\frac{a}{2} - \frac{qE_0L}{4U}\right)}\right) - 1\right], \quad (11)$$

for $a > \frac{qE_0L}{2U}$.

Equation (9) is similar to Equation (7) because it is also an oscillating function, which is not very desirable in terms of dispersion magnitude. Equation (10) gives a linear relationship between $\Delta x$ and $E_0$, which is better than Equation (9). However, the best case is given by Equation (11) which shows an exponential relationship.

Figure 6:
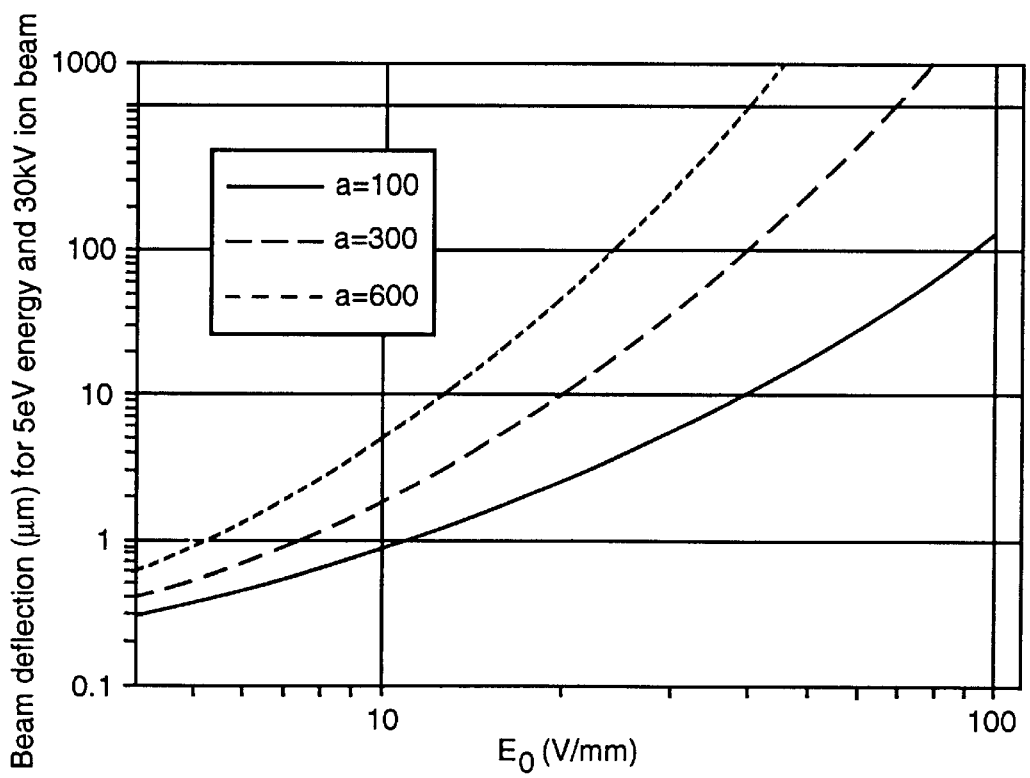
FIG. 6 plots the dispersion against the electric field for the energy filter shown in FIG. 5.
Figure 7:
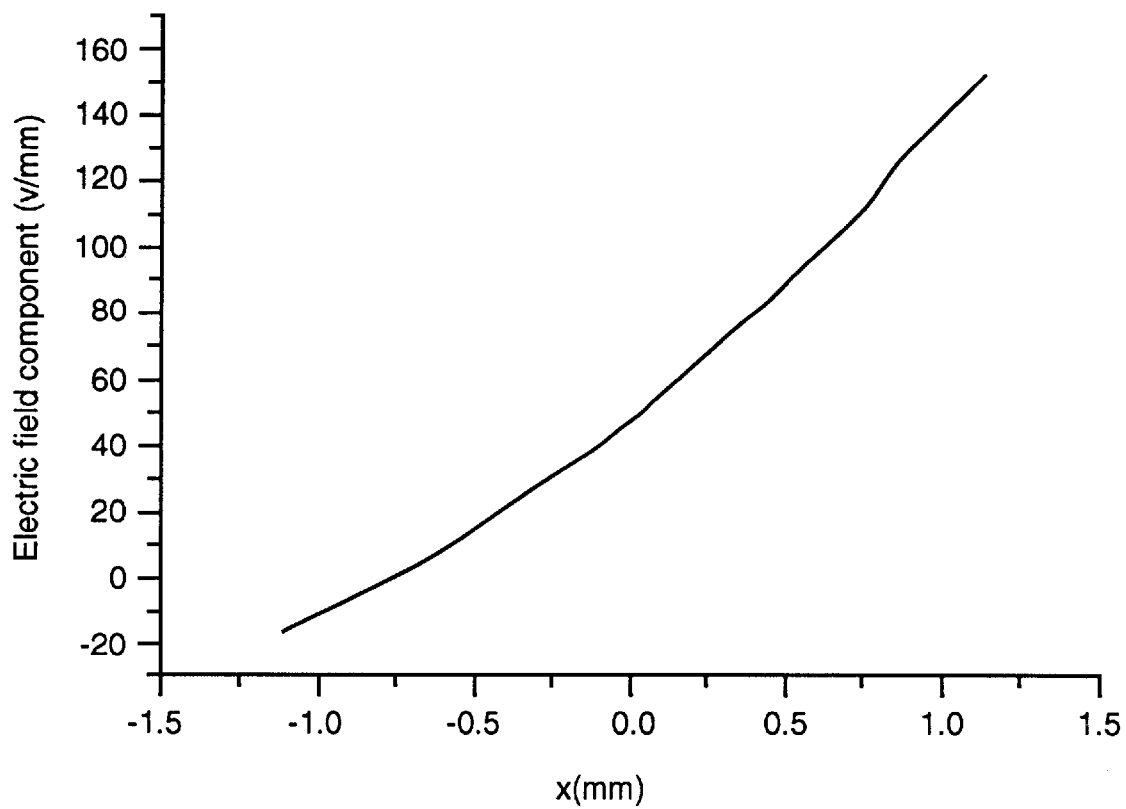
FIG. 7 plots the electric field component in the x direction for the energy filter shown in FIG. 5.

FIG. 6 plots the dispersion $\Delta x$ against the electric field $E_0$ for $a > qE_0L/2U$ and $a = 100, 300$ and $600$, where the energy spread $\Delta U = 5$ eV, the beam energy $U = 30$ keV, $L = 300$ mm, each of the cylinders 148–151 have a radius $r = 1.5$ mm and are separated by a distance $d = 6$ mm. As shown in FIG. 6, the dispersion $\Delta x$ can be very large as long as a is large enough and $E_0$ is appropriate. In practice, the beam selecting aperture for the largest beam current in both the crossover mode and the non-crossover mode is typically less than 1 mm in radius. Thus, if the energy spread is to be reduced to 1 eV and the radius of the Wien filter aperture is 0.1 mm, then the dispersion $\Delta x$ needed for an energy spread $\Delta U = 5$ eV is less than 0.5 mm. According to FIG. 6, the quadrupole type energy filter 140 shown in FIG. 5 can accomplish the desired result if $a = 600$, $E_0 = 34$V/mm, and $L = 300$ mm. To realize these values of a and $E_0$, the voltages on the cylinders 148, 149, 150, and 151 of the quadrupole structure 142 are estimated to be $V_1 = 175$V, $V_2 = -85$V, $V_3 = -5$V and $V_4 = -85$V, respectively. The strength of the magnetic field is 0.119 Tesla. FIG. 7 plots the electric field component in the x direction under the above voltages.

While the present invention has been described in connection with specific embodiments, one of ordinary skill in the art will recognize that various substitutions, modifications and combinations of the embodiments may be made after having reviewed the present disclosure. The specific embodiments described above are illustrative only. Various adaptations and modifications may be made without departing from the scope of the invention. For example, various types of energy filters, other than a quadrupole Wien type filter, may be used in accordance with the present invention. In addition, while the present invention is described as used with an ion beam, it should be understood that the present invention may be used with any charged particle beam including an electron beam. The spirit and scope of the appended claims should not be limited to the foregoing description.

What is claimed is:

1. A charged particle beam apparatus comprising:
   a charged particle source, wherein said charged particles are ions; and
   an energy filter downstream of said charged particle source, said energy filter reducing the energy spread of the charged particle beam by passing a specific energy range of charged particles and dispersing the undesired energy ranges, wherein said energy filter creates an energy dispersion in one direction such that the rate of reduction of the energy spread is larger than the rate of the increase of the acceptance half angle.

* * * * *